(12) United States Patent
Narumi

(10) Patent No.: US 11,495,901 B2
(45) Date of Patent: Nov. 8, 2022

(54) ELECTRIC CONNECTION SOCKET CONNECTING A CIRCUIT BOARD AND AN INTEGRATED CIRCUIT PACKAGE

(71) Applicant: Enplas Corporation, Saitama (JP)

(72) Inventor: Keiichi Narumi, Santa Clara, CA (US)

(73) Assignee: Enplas Corporation, Saitama (JP)

( * ) Notice: Subject to any disclaimer, the term of this patent is extended or adjusted under 35 U.S.C. 154(b) by 267 days.

(21) Appl. No.: 16/761,254

(22) PCT Filed: Jun. 29, 2018

(86) PCT No.: PCT/JP2018/024822
§ 371 (c)(1),
(2) Date: May 3, 2020

(87) PCT Pub. No.: WO2019/049482
PCT Pub. Date: Mar. 14, 2019

(65) Prior Publication Data
US 2021/0408736 A1    Dec. 30, 2021

Related U.S. Application Data

(60) Provisional application No. 62/568,806, filed on Oct. 6, 2017, provisional application No. 62/555,793, filed on Sep. 8, 2017.

(51) Int. Cl.
*H01R 12/71* (2011.01)
*G01R 1/067* (2006.01)
(Continued)

(52) U.S. Cl.
CPC ....... *H01R 12/718* (2013.01); *G01R 1/06722* (2013.01); *G01R 1/07314* (2013.01);
(Continued)

(58) Field of Classification Search
CPC ...... H01R 12/718; H01R 12/57; H01R 12/58; H01R 12/714; H01R 13/193;
(Continued)

(56) References Cited

U.S. PATENT DOCUMENTS

2010/0244872 A1    9/2010    Yoshida et al.
2013/0203298 A1    8/2013    Zhou et al.

FOREIGN PATENT DOCUMENTS

JP    2009-129877    6/2009
JP    2009129877 A  *  6/2009
(Continued)

OTHER PUBLICATIONS

International Search Report and the Written Opinion dated Sep. 4, 2018 From the International Searching Authority Re. Application No. PCT/JP2018/024822 and Its Translation of Search Report Into English. (9 Pages).

*Primary Examiner* — Abdullah A Riyami
*Assistant Examiner* — Justin M Kratt

(57) ABSTRACT

An electric connection socket for relaying electric signals between a circuit substrate and an electric component includes: a metal housing which has a through hole enabling communication between the top surface and the bottom surface thereof, and on the top surface of which the electric component is mounted and on the bottom surface of which the circuit substrate is mounted; and a signal pin inserted into the through hole to configure a coaxial line between the inner wall surfaces of the through hole, and which is electrically connected at one end to a signal path first pad electrode of the circuit substrate and is electrically connected at the other end to a signal path terminal of the electric component. On the bottom surface, the metal housing has a ground connection unit which contacts a second (Continued)

pad electrode for grounding formed on the circuit substrate and which grounds the metal housing.

6 Claims, 5 Drawing Sheets

(51) Int. Cl.
    *G01R 1/073* (2006.01)
    *H01R 12/57* (2011.01)
    *H01R 13/193* (2006.01)
    *H01R 13/6473* (2011.01)
    *H01R 13/6594* (2011.01)
    *H01R 12/58* (2011.01)
    *H01R 12/55* (2011.01)
    *H01R 24/40* (2011.01)
    *H01R 12/73* (2011.01)

(52) U.S. Cl.
    CPC ............ *H01R 12/57* (2013.01); *H01R 12/58* (2013.01); *H01R 12/714* (2013.01); *H01R 13/193* (2013.01); *H01R 13/6473* (2013.01); *H01R 13/6594* (2013.01); *H01R 12/55* (2013.01); *H01R 12/71* (2013.01); *H01R 12/712* (2013.01); *H01R 12/716* (2013.01); *H01R 12/73* (2013.01); *H01R 24/40* (2013.01)

(58) Field of Classification Search
    CPC ............ H01R 13/6473; H01R 13/6594; H01R 12/55; H01R 12/71; H01R 12/712; H01R 12/716; H01R 24/40; H01R 12/73; G01R 1/06722; G01R 1/07314
    See application file for complete search history.

(56) References Cited

FOREIGN PATENT DOCUMENTS

| | | |
|---|---|---|
| JP | 2010-237133 | 10/2010 |
| JP | 2012-103028 | 5/2012 |
| JP | 2015-507198 | 3/2015 |
| WO | WO 2019/049482 | 3/2019 |

\* cited by examiner

ELECTRIC CONNECTION SOCKET CONNECTING A CIRCUIT BOARD AND AN INTEGRATED CIRCUIT PACKAGE

RELATED APPLICATIONS

This application is a National Phase of PCT Patent Application No. PCT/JP2018/024822 having International filing date of Jun. 29, 2018, which claims the benefit of priority under 35 USC § 119(e) of U.S. Provisional Patent Application Nos. 62/568,806 filed on Oct. 6, 2017 and 62/555,793 filed on Sep. 8, 2017. The contents of the above applications are all incorporated by reference as if fully set forth herein in their entirety.

FIELD AND BACKGROUND OF THE INVENTION

The present disclosure relates to an electrical connection socket.

An electrical connection socket that relays electric signals between an electric component (integrated circuit (IC) package, for example) and a circuit substrate (printed circuit board (PCB) substrate, for example) is known (see Patent Literature 1 (hereinafter, abbreviated as PTL), for example).

CITATION LIST

Patent Literature

PTL 1
Japanese Unexamined Patent Application Publication (Translation of PCT Application) No. 2015-507198

SUMMARY OF THE INVENTION

Such an electrical connection socket is required to relay high-frequency (10 GHz, for example) electric signals because of a recent demand for an increase of data transfer rate. Thus, in a recent electrical connection socket, a metal housing connected to the ground is used so that signal degradation can be suppressed. The electrical connection socket is configured such that a signal pin that performs signal transmission and a ground pin that supplies a ground voltage are disposed in a plurality of through holes disposed to pass between the upper surface and the lower surface of the metal housing.

In the electrical connection socket, for example, the signal pin is disposed away from the inner wall surface of the through hole and disposed to constitute a coaxial line by the signal pin and the inner wall surface of the through hole. Having such a configuration, the signal pin provides an impedance-matched signal path between an electric component and a circuit substrate. The ground pin is disposed so as to be in contact at the tip portion thereof with a ground-use pad electrode formed on the circuit substrate and in contact, in the through hole, with the inner wall surface of the through hole.

In other words, in the electrical connection socket according to an existing art, grounding of the metal housing is performed via the ground pin. However, as a result of earnest examination of the inventor of the present application, the thus grounded metal housing is found to be in a state in which a ground voltage is unstable.

Specifically, in the electrical connection socket according to an existing art, electrical connection between the ground pin and the metal housing is performed through contact between the outer circumferential surface of the ground pin and the inner wall surface of the through hole of the metal housing. The ground connection of the metal housing is thus performed through an impedance generated due to contact resistance between the outer circumferential surface of the ground pin and the inner wall surface of the through hole. In addition, the ground connection of the metal housing becomes unstable depending on a held state (tilted state, for example) and the like of the ground pin. As a result, the ground voltage of the metal housing becomes unstable. This causes characteristic impedance of the signal path constituted by the signal pin to be unstable, which may lead to signal degradation due to reflection in the signal path.

The present disclosure has been made in consideration of the aforementioned problems, and an object of the present disclosure is to provide an electrical connection socket capable of stabilizing the ground voltage of a metal housing and suppressing signal degradation during signal transmission.

The present disclosure mainly solving the problem mentioned above is an electrical connection socket that relays an electric signal between a circuit substrate and an electric component, the electrical connection socket including:

a metal housing including a first through hole passing between an upper surface and a lower surface of the metal housing, the electric component being to be disposed on a side of the upper surface, the circuit substrate being to be disposed on a side of the lower surface; and a signal pin inserted into the first through hole to constitute a coaxial line together with an inner wall surface of the first through hole, the signal pin including a first end to be electrically connected to a signal-path-use first pad electrode of the circuit substrate and a second end to be electrically connected to a signal-path-use first terminal of the electric component, in which the metal housing includes a ground connection portion on the lower surface, the ground connection portion being configured to come into contact with a ground-use second pad electrode formed on the circuit substrate and ground the metal housing.

An electrical connection socket according to the present disclosure can stabilize the ground voltage of a metal housing and suppress signal degradation during signal transmission.

DESCRIPTION OF SPECIFIC EMBODIMENTS OF THE INVENTION

A suitable embodiment of the present disclosure will be described below in detail with reference to the accompanying drawings. In the present description and the drawings, duplicate description of constituent components having functions substantially identical to each other is omitted by giving identical reference signs thereto.

[Overall Configuration of Electrical Connection Socket]

Hereinafter, with reference to FIG. 1 to FIG. 5, an example of the configuration of an electrical connection socket according to an embodiment will be described.

Figure 1:
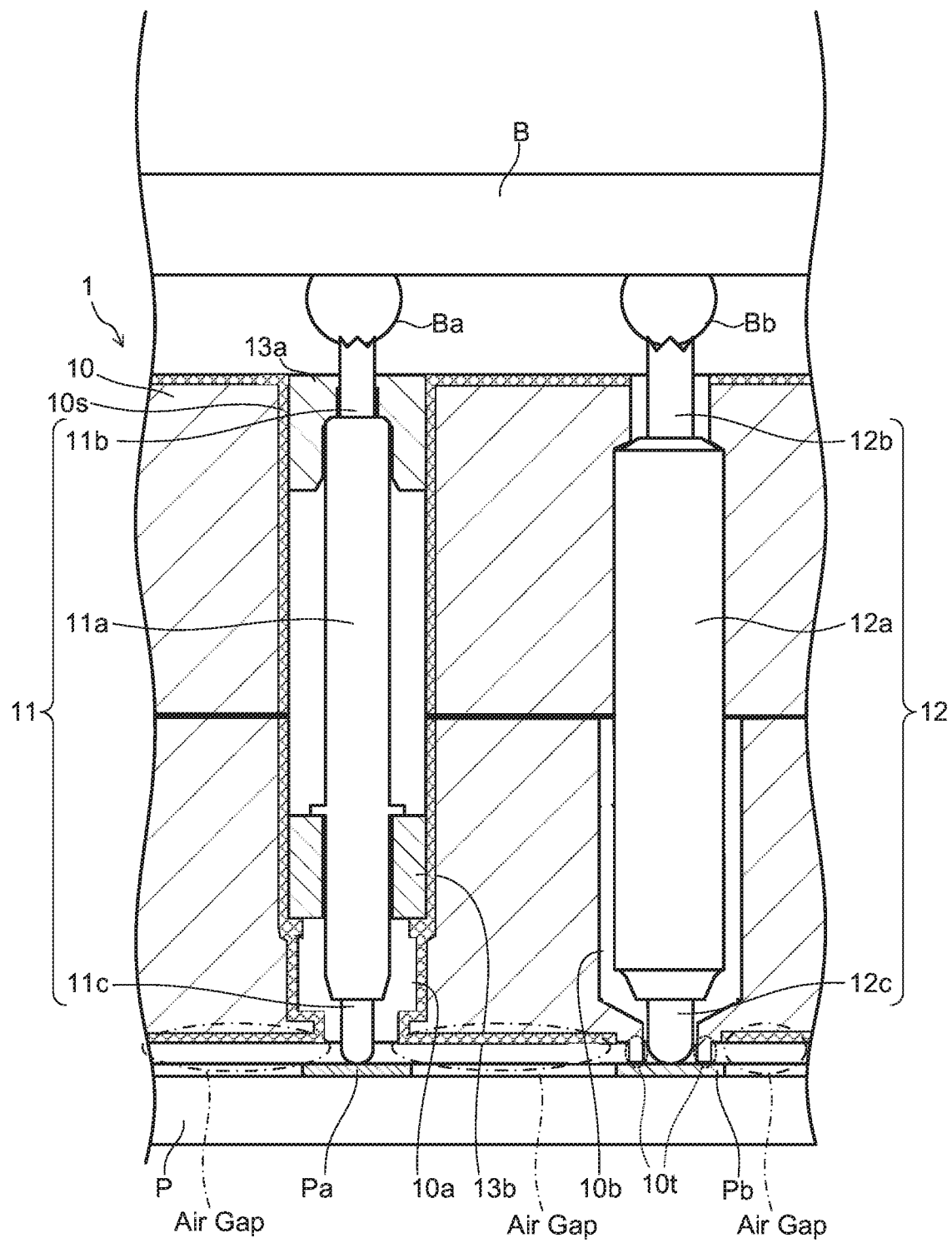
FIG. 1 is a side sectional view of an electrical connection socket according to an embodiment.

FIG. 1 is a side sectional view of electrical connection socket 1 according to the present embodiment.

Figure 2:
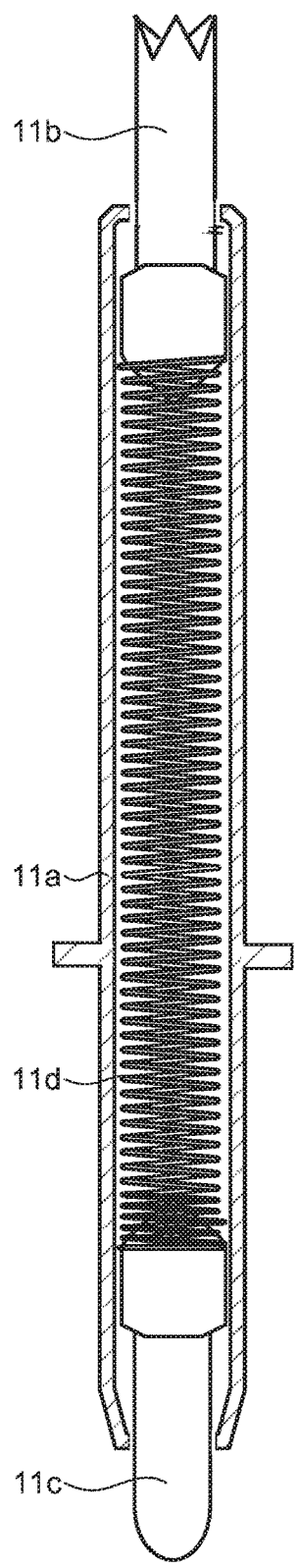
FIG. 2 is a side sectional view of a signal pin of the electrical connection socket according to an embodiment.
Figure 3:
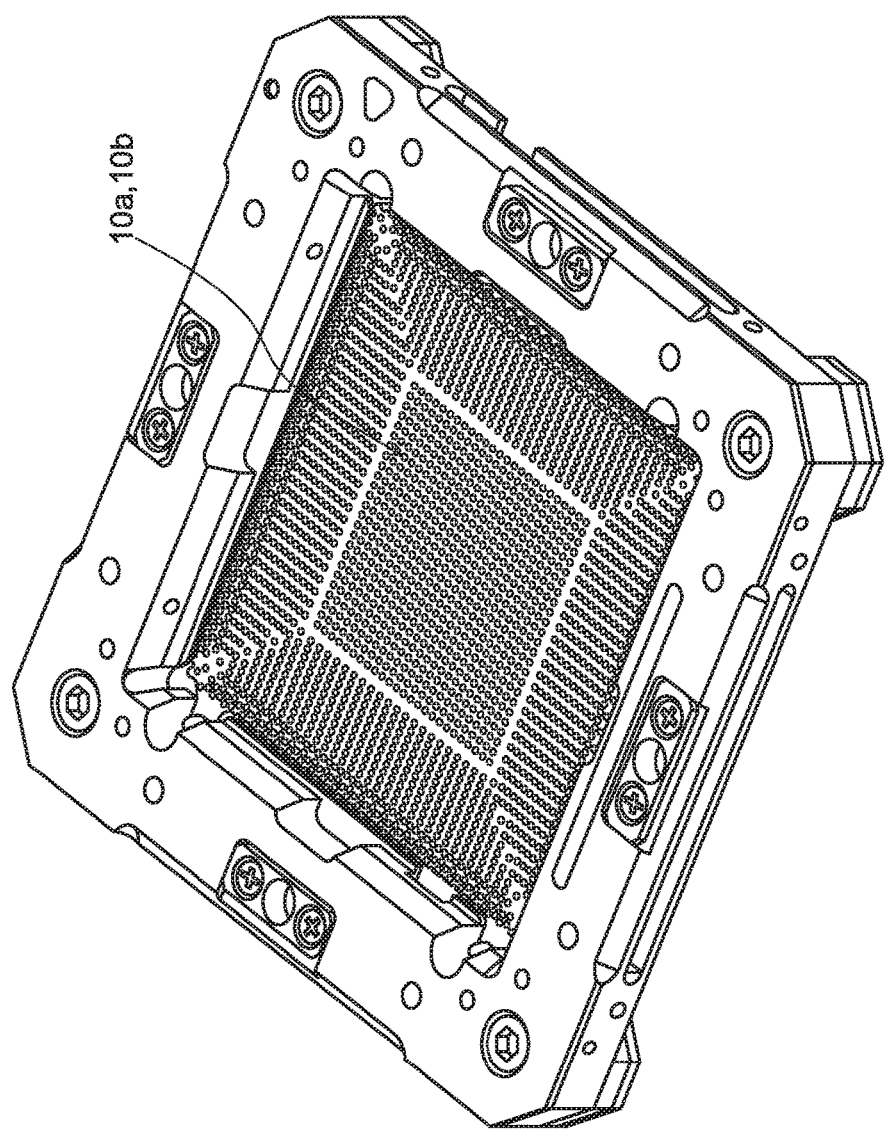
FIG. 3 is a perspective view in which a metal housing of the electrical connection socket according to an embodiment is viewed from the top.
Figure 4:
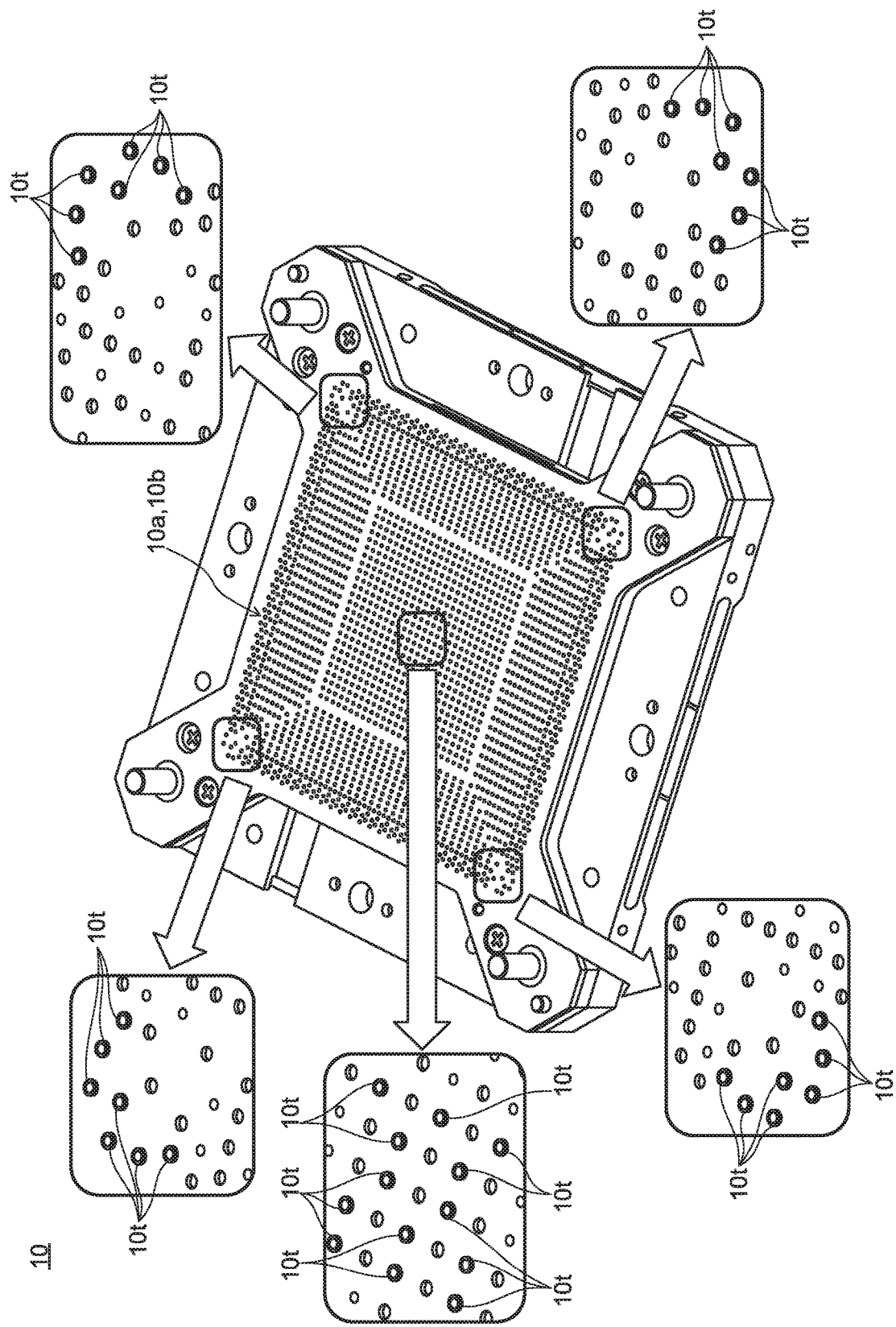
FIG. 4 is a perspective view in which the metal housing of the electrical connection socket according to an embodiment is viewed from the bottom.
Figure 5:
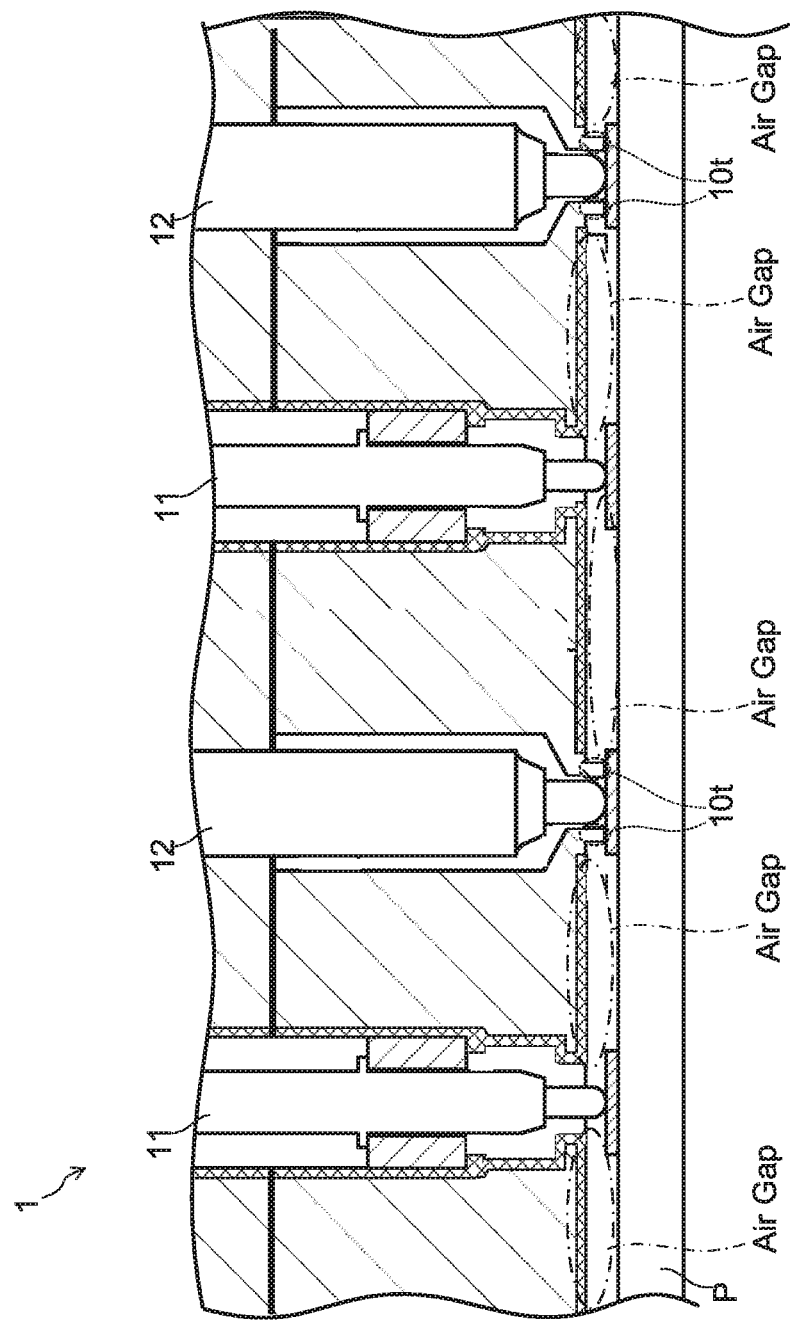
FIG. 5 illustrates air gaps formed on the lower surface side of the metal housing in the electrical connection socket according to an embodiment.

FIG. 2 is a side sectional view of signal pin 11 of electrical connection socket 1 according to the present embodiment. FIG. 3 is a perspective view in which metal housing 10 of electrical connection socket 1 according to the present embodiment is viewed from the top. FIG. 4 is a perspective view in which metal housing 10 of electrical connection socket 1 according to the present embodiment is viewed from the bottom. FIG. 5 illustrates air gaps formed on the lower surface side of metal housing 10 in electrical connection socket 1 according to the present embodiment.

Electrical connection socket 1 according to the present embodiment is a surface-mount type socket and to be mounted on circuit substrate P. IC package B is mounted on an upper portion of electrical connection socket 1. In the following description, the circuit substrate P side as viewed from electrical connection socket 1 is referred to as the lower side (corresponding to the lower side of FIG. 1), and the IC package B side is referred to as the upper side (corresponding to the upper side of FIG. 1).

Electrical connection socket 1 according to the present embodiment is applied to, for example, an intended use of performing a performance test of IC package B. Electrical connection socket 1 performs electrical connection between IC package B disposed on the upper surface side thereof and circuit substrate P of an IC test apparatus disposed on the lower surface side thereof. Incidentally, the most efficient method in which a data transfer rate is maintained is soldering IC package B directly to circuit substrate P; however, here, electrical connection using electrical connection socket 1 is employed to make circuit substrate P and IC package B detachable from each other.

IC package B is, for example, a BGA (Ball Grid Array)-type IC package. IC package B includes, for example, as terminals for external connection, signal-path-use first solder ball Ba (first terminal) and ground-connection-use second solder ball Bb (second terminal) that project downward from the lower surface of the body of the package.

IC package B is mounted on electrical connection socket 1 by a latch (not illustrated) disposed on electrical connection socket 1. In a state in which the latch is closed, IC package B is mounted on electrical connection socket 1 with the upper surface thereof being pressed. IC package B is detachable from electrical connection socket 1 by opening the latch.

Circuit substrate P is, for example, a PCB (Printed Circuit Board) substrate. For example, a signal-path-use circuit pattern that generates a signal for performing a performance test of IC package B and that performs reception processing of a signal from IC package B, a ground pattern for supplying a ground voltage, and the like are formed on circuit substrate P. On circuit substrate P, first pad electrode Pa connected to the signal-path-use circuit pattern and second pad electrode Pb connected to the ground pattern are formed in a state of being exposed from the surface of circuit substrate P.

Electrical connection socket 1 is mounted with respect to circuit substrate P by a bolt and a nut, and the like.

Electrical connection socket 1 includes, for example, metal housing 10, signal pin 11 that performs signal transmission between circuit substrate P and IC package B, and ground pin 12 that supplies a ground voltage from circuit substrate P to IC package B.

Metal housing 10 is formed of, for example, a metal member of aluminum or copper, and the like. Metal housing 10 has conductivity with, for example, the entirety thereof formed of aluminum, and a ground voltage ensured at ground connection portion 10t (details will be described later) on the lower surface of metal housing 10 is supplied to the entirety of metal housing 10.

Metal housing 10 is constituted by an upper plate and a lower plate that are connected to each other by using fixing members (a bolt and a nut, for example). Metal housing 10 may be integrally constituted by a member or may be constituted by a plurality of plates joined to each other. Metal housing 10 may include a portion constituted by an insulation material.

Metal housing 10 includes first through hole 10a into which signal pin 11 is inserted and second through hole 10b into which ground pin 12 is inserted. Each of first through hole 10a and second through hole 10b is formed to pass from the upper surface to the lower surface of metal housing 10. First through hole 10a and second through hole 10b each have, for example, a circular shape in plan view.

In the exposed surface of metal housing 10, regions (hatched portions 10s in FIG. 1) that require electrical insulation are anodized. Here, the inner wall surface of first through hole 10a of metal housing 10, some portions of the lower surface of metal housing 10, and the upper surface of metal housing 10 are anodized regions 10s. Consequently, electrical insulation between metal housing 10 and signal pin 11, electrical insulation between metal housing 10 and circuit substrate P, and electrical insulation between metal housing 10 and IC package B are reinforced.

Signal pin 11 is disposed in first through hole 10a so as to be away from the inner wall surface of first through hole 10a. In other words, signal pin 11 is disposed in first through hole 10a in a state of being electrically insulated from metal housing 10 and constitutes a coaxial line between signal pin 11 and the inner wall surface of first through hole 10a. The distance between the outer circumferential surface of signal pin 11 (pin barrel 11a) and the inner wall surface of first through hole 10a is adjusted such that the characteristic impedance of the coaxial line constituted by signal pin 11 has a predetermined value (50Ω, for example) at each position. Having such a configuration, signal pin 11 provides an impedance-matched signal path between IC package B and circuit substrate P.

Signal pin 11 is configured to include pin barrel 11a, first plunger 11b, second plunger 11c, and spring 11d (see FIG. 2).

Pin barrel 11a is a cylindrical member and disposed in first through hole 10a to extend along first through hole 10a in the up-down direction. Pin barrel 11a is fixed in first through hole 10a in a state of being away from the inner wall surface of first through hole 10a due to, for example, holding members 13a and 13b having insulation.

Holding member 13a has an annular shape and is press-fitted on the upper side of first through hole 10a into first through hole 10a. Holding member 13b has an annular shape and is press-fitted on the lower side of pin barrel 11a to be locked to first through hole 10a. Pin barrel 11a is fixed via holding members 13a and 13b so as to be held from the upper and lower sides in first through hole 10a.

First plunger 11b is coupled to an upper end portion of pin barrel 11a in a state of being slidable in the up-down direction. First plunger 11b is configured such that a lower end portion thereof is connected to an upper end portion of spring 11d disposed in pin barrel 11a and an upper end portion thereof projects upward from an opening formed in the upper end portion of pin barrel 11a. The upper end portion of first plunger 11b projects upward more than the upper surface of metal housing 10. Due to such a configuration, when IC package B is mounted on electrical connection socket 1, the upper end portion of first plunger 11b is in contact with signal-path-use first solder ball Ba of IC package B. Consequently, electrical connection between signal pin 11 and the signal path in IC package B is performed. The upper end portion of first plunger 11b has a recessed shape extending along the outer shape of first solder ball Ba so as to come into contact with first solder ball Ba easily.

Second plunger 11c is coupled to a lower end portion of pin barrel 11a in a state of being slidable in the up-down direction. Second plunger 11c is configured such that an upper end portion thereof is connected to a lower end portion of spring 11d disposed in pin barrel 11a and a lower end portion thereof projects downward from an opening formed in the lower end portion of pin barrel 11a. The lower end portion of second plunger 11c projects downward more than the lower surface of metal housing 10. Due to such a configuration, when electrical connection socket 1 is mounted on circuit substrate P, the lower end portion of second plunger 11c is in contact with signal-path-use first pad electrode Pa formed on circuit substrate P. Consequently, electrical connection between signal pin 11 and the signal path in circuit substrate P is performed.

Spring 11d is disposed between first plunger 11b and second plunger 11c in pin barrel 11a and urges first plunger 11b in the up direction and urges second plunger 11c in the down direction. Consequently, a contact pressure between the upper end portion of first plunger 11b and first solder ball Ba of IC package B and a contact pressure between the lower end portion of second plunger 11c and first pad electrode Pa of circuit substrate P are ensured. Spring 11d is configured to be in contact with the inner wall surface of pin barrel 11a and electrically connects first plunger 11b, pin barrel 11a, and second plunger 11c to each other.

Pin barrel 11a, first plunger 11b, second plunger 11c, and spring 11d are each constituted by a metal member. As described above, these members are disposed in a state of being electrically insulated from the inner wall surface of first through hole 10a.

In such a configuration, when the upper end portion of first plunger 11b comes into contact with first solder ball Ba of IC package B and the lower end portion of second plunger 11c comes into contact with first pad electrode Pa of circuit substrate P, signal pin 11 relays a signal transmission between IC package B and circuit substrate P.

In second through hole 10b, ground pin 12 (pin barrel 12a) is disposed in contact with the inner wall surface of second through hole 10b. In other words, ground pin 12 is disposed in second through hole 10b in a state of being electrically connected at the inner wall surface of second through hole 10b to metal housing 10. More preferably, ground pin 12 is disposed to be electrically connected in an upper-side region in second through hole 10b to second through hole 10b.

Similarly to signal pin 11, ground pin 12 is configured to include pin barrel 12a, first plunger 12b, second plunger 12c, and a spring (not illustrated).

Ground pin 12 is constituted by a structure substantially identical to that of signal pin 11. In other words, when IC package B is mounted on electrical connection socket 1, an upper end portion of first plunger 12b is in contact with ground-use second solder ball Bb of IC package B, and a lower end portion of second plunger 12c is in contact with ground-use second pad electrode Pb formed on circuit substrate P. Consequently, a ground voltage of circuit substrate P is supplied to the ground pattern of IC package B via ground pin 12.

As described above, ground pin 12 is disposed in contact with the inner wall surface of second through hole 10b of metal housing 10.

For convenience of description, FIG. 1 shows only one signal pin 11 and one ground pin 12; however, electrical connection socket 1 includes a plurality of signal pins 11 and ground pins 12 similar to those in FIG. 1. FIG. 3 and FIG. 4 show a plurality of first through holes 10a and a plurality of second through holes 10b formed in metal housing 10, and signal pin 11 and ground pin 12 are inserted into each of first through holes 10a and each of second through holes 10b, respectively (illustration of signal pins 11 and ground pins 12 is omitted in FIG. 3 and FIG. 4). Electrical connection socket 1 may include a power pin for supplying operating power from circuit substrate P to IC package B.

[Configuration of Ground Connection Portion of Electrical Connection Socket]

Metal housing 10 according to the present embodiment includes ground connection portion 10t that electrically connects metal housing 10 to ground-use second pad electrode Pb of circuit substrate P.

Ground connection portion 10t is, for example, a projecting portion (hereinafter also referred to as "projecting portion 10t") projecting downward from the lower surface of metal housing 10. Similarly to metal housing 10, projecting portion 10t is constituted by a metal member (aluminum material, for example). The surface of projecting portion 10t is not anodized, and projecting portion 10t is in a state in which the metal member is exposed.

Projecting portion 10t is formed on the lower surface of metal housing 10 to have, for example, a ring shape so as to surround the periphery of second through hole 10b into which ground pin 12 is inserted (see FIG. 4). Projecting portion 10t is in contact at a lower end portion of projecting portion 10t with second pad electrode Pb in an outer peripheral region of a region in which ground pin 12 is in contact with second pad electrode Pb of circuit substrate P. Consequently, projecting portion 10t grounds metal housing 10.

Electrical connection socket 1 according to the present embodiment thus connects metal housing 10 to the ground via projecting portion 10t without ground pin 12 interposed therebetween. Consequently, the ground potential of metal housing 10 becomes stable, and it is thus possible to properly hold the characteristic impedance of the coaxial line constituted by signal pin 11. Consequently, it is also possible to suppress occurrence of signal interference between the signal pin 11 and the other signal pin 11.

Supplying of the ground voltage from projecting portion 10t is also performed for ground pin 12 via a contact portion between the inner wall surface of second through hole 10b and ground pin 12. In particular, in the present embodiment, ground pin 12 is disposed in a state of being away from the inner wall surface of second through hole 10b in a lower region of second through hole 10b and is disposed in contact with the inner wall surface of second through hole 10b in an upper region of second through hole 10b. Consequently, it is also possible to stabilize the ground potential in the upper region of ground pin 12, in which grounding becomes easily unstable.

Typically, a plurality of projecting portions 10*t* are formed on the lower surface of metal housing 10 so as to surround the respective periphery of the plurality of second through holes 10*b* (see FIG. 4). The plurality of projecting portions 10*t* are disposed, for example, in regions at four corners of the lower surface of metal housing 10 and a region at the center of the lower surface of metal housing 10 to support metal housing 10 from below.

Due to such a plurality of projecting portions 10*t*, electrical connection socket 1 according to the present embodiment forms air gaps (see FIG. 5) between the lower surface (here, in a region between one projecting portion 10*t* and another projecting portion 10*t*) of metal housing 10 and the upper surface of circuit substrate P when electrical connection socket 1 is mounted on circuit substrate P. Consequently, crosstalk between the signal path formed on circuit substrate P and metal housing 10 is reduced.

The projecting height of projecting portions 10*t* is preferably set, for example, to cause the air gaps between the lower surface of metal housing 10 and the upper surface of circuit substrate P to be 0.1 mm or more. An area in which projecting portions 10*t* are disposed is preferably set to cause an air gap region to be 95% or more a region in which the lower surface of metal housing 10 and the upper surface of circuit substrate P face each other, even considering necessity of grounding of metal housing 10 by projecting portions 10*t*.

Ground connection portion 10*t* in a form of projecting from the lower surface of metal housing 10 is presented here as an example; however, an insulation member may be disposed at the periphery of ground connection portion 10*t*.

[Usage Form of Electrical Connection Socket]

Next, a usage form of electrical connection socket 1 according to the present embodiment will be described.

First, electrical connection socket 1 is mounted on circuit substrate P. At this time, projecting portion 10*t* disposed on the lower surface of metal housing 10 comes into contact with ground-use second pad electrode Pb of circuit substrate P. Consequently, metal housing 10 is electrically connected directly to ground-use second pad electrode Pb of circuit substrate P and becomes in a state in which a stable ground voltage is ensured.

Next, IC package B is mounted on electrical connection socket 1. Then, when the upper surface of IC package B is pressed in the down direction by using the latch disposed on electrical connection socket 1, first solder ball Ba and second solder ball Bb of IC package B abut first plunger 11*b* of signal pin 11 and first plunger 12*b* of ground pin 12, respectively. Consequently, electrical contact between signal-path-use first solder ball Ba and first plunger portion 11*b* of signal pin 11 and electrical contact between ground-use second solder ball Bb and first plunger portion 12*b* of ground pin 12 are ensured.

In response to IC package B lowering, second plunger 11*c* of signal pin 11 and second plunger 12*c* of ground pin 12 respectively abut signal-path-use first pad electrode Pa and ground-use second pad electrode Pb that are on circuit substrate P. Consequently, electrical contact between signal-path-use first pad electrode Pa and second plunger portion 11*c* of signal pin 11 and electrical contact between ground-use second pad electrode Pb and second plunger portion 12*c* of ground pin 12 are ensured.

At this time, the urging force of spring 11*d* acts on each of first plunger portion 11*b* and second plunger portion 11*c* of signal pin 11 in a direction in which first plunger portion 11*b* and second plunger portion 11*c* are separated from each other in the up-down direction. Similarly, the urging force of the spring (not illustrated) acts on each of first plunger portion 12*b* and second plunger portion 12*c* of ground pin 12 in a direction in which first plunger portion 12*b* and second plunger portion 12*c* are separated from each other in the up-down direction. Consequently, a contact pressure between first and second solder balls Ba and Bb of IC package B and first plunger portions 11*b* and 12*b* of pins 11 and 12 and a contact pressure between first pad electrodes Pa and Pb of circuit substrate P and second plunger portions 11*c* and 12*c* of pins 11 and 12 are maintained in a properly ensured state.

By thus electrically connecting IC package B and circuit substrate P to each other via electrical connection socket 1, a performance test and the like of IC package B are performed. At this time, the ground voltage of metal housing 10 is held in a stable state, and signal transmission via signal pin 11 is thus performed in a state in which signal degradation is suppressed.

[Effects]

As described above, in electrical connection socket 1 according to the present embodiment, metal housing 10 includes, on the lower surface thereof, ground connection portion 10*t* that comes into contact with ground-use second pad electrode Pb formed on circuit substrate P and that grounds metal housing 10.

Therefore, electrical connection socket 1 according to the present embodiment enables metal housing 10 to be directly, without ground pin 12 interposed therebetween, grounded by ground connection portion 10*t*. Consequently, it is possible to stabilize the ground potential of metal housing 10. The characteristic impedance of the coaxial line constituted by signal pin 11 is thereby stabilized, and signal degradation due to reflection can be suppressed during signal transmission between IC package B and circuit substrate P. Consequently, it is also possible to suppress signal interference between one signal pin 11 and another signal pin 11.

In electrical connection socket 1 according to the present embodiment, ground connection portion 10*t* has a projecting shape that projects downward from the lower surface of metal housing 10. Consequently, when electrical connection socket 1 is mounted on circuit substrate P, air gaps (voids) can be formed between the lower surface of metal housing 10 and the upper surface of circuit substrate P. This makes it possible to suppress crosstalk between the signal path formed in circuit substrate P and the lower surface of metal housing 10.

In electrical connection socket 1 according to the present embodiment, ground connection portion 10*t* is disposed at the periphery of second through hole 10*b* at the lower surface of metal housing 10 and is in contact with second pad electrode Pb in the outer peripheral region of the region in which ground pin 12 is in contact with second pad electrode Pb. Consequently, second pad electrode Pb for ground pin 12, the second pad electrode Pb being formed on circuit substrate P, can be used as it is to connect ground connection portion 10*t* to the ground.

Other Embodiments

The present invention is not limited to the aforementioned embodiment and can be variously modified.

In the aforementioned embodiment, as an example of the held form of signal pin 11, a form in which signal pin 11 is held so as to be away from the inner wall surface of first through hole 10a is presented. Signal pin 11 is, however, not limited thereto provided that signal pin 11 is electrically insulated from metal housing 10, and a configuration in which an insulation member is interposed between signal pin 11 and the inner wall surface of first through hole 10a may be employed. In addition, pin barrel 11a of signal pin 11 is not necessarily fixed; pin barrel 11a may be configured to be slidable in first through hole 10a.

In the aforementioned embodiment, as an example of the configuration of electrical connection socket 1, a form including ground pin 12 is presented. Electrical connection socket 1, however, may be configured not to include ground pin 12 in consideration of grounding of metal housing 10 to be performed by ground connection portion 10t.

In the aforementioned embodiment, as an example of electric component B that is to be connected to the upper side of electrical connection socket 1, IC package B is presented. Electric component B to be connected to the upper side of electrical connection socket 1, however, may be a coaxial cable or the like.

In the aforementioned embodiment, as an example of the intended use of electrical connection socket 1, a form used for a test of IC package B is presented. Electrical connection socket 1 is, however, applicable as a matter of course to any intended uses for electrical connection other than that for a test of IC package B.

Specific examples of the present invention have been described above in detail; however, those are presented merely as examples and do not limit the claims. The technologies disclosed in the claims include various deformations and modifications of the specific examples presented above.

The disclosure of U.S. provisional application No. 62/555,793, filed on Sep. 8, 2017, and the disclosure of U.S. provisional application No. 62/568,806, filed on Oct. 6, 2017, are all incorporated herein by reference in their entirety.

INDUSTRIAL APPLICABILITY

The electrical connection socket according to the present disclosure can stabilize the ground voltage of a metal housing and suppress signal degradation during signal transmission.

REFERENCE SIGNS LIST

1 Electrical connection socket
10 Metal housing
10a First through hole
10b Second through hole
10s Anodized region
10t Ground connection portion
11 Signal pin
11a Pin barrel
11b First plunger
11c Second plunger
11d Spring
12 Ground pin
12a Pin barrel
12b First plunger
12c Second plunger
13a, 13b Holding member
B IC package
Ba First solder ball
Bb Second solder ball
P Circuit substrate
Pa First pad electrode
Pb Second pad electrode

The invention claimed is:

1. An electrical connection socket that relays an electric signal between a circuit substrate and an electric component, the electrical connection socket comprising:
a metal housing including a first through hole and a plurality of second through holes passing between an upper surface and a lower surface of the metal housing, the electric component to be disposed on a side of the upper surface, the circuit substrate to be disposed on a side of the lower surface;
a signal pin inserted into the first through hole to constitute a coaxial line together with an inner wall surface of the first through hole, the signal pin including a first end to be electrically connected to a signal-path-use first pad electrode of the circuit substrate and a second end to be electrically connected to a signal-path-use first terminal of the electric component; and
a plurality of ground pins inserted into the plurality of second through holes respectively passing between the upper surface and the lower surface of the metal housing, the ground pin including a first end to be electrically connected to ground-use second pad electrodes of the circuit substrate and a second end to be electrically connected to ground-use second terminals of the electric component, wherein
the metal housing includes a plurality of projecting portions that project downward from the lower surface of the metal housing respectively,
the plurality of projecting portions are respectively configured to come into contact with the second pad electrodes formed on the circuit substrate and ground the metal housing,
the plurality of projecting portions are respectively disposed in outer peripheral regions of regions in which the plurality of ground pins are in contact with the second pad electrodes so as to be in contact with the second pad electrodes, and
the plurality of projecting portions are individually disposed at a periphery of each of the plurality of second through holes at the lower surface of the metal housing so as to form air gaps between the lower surface of the metal housing and the upper surface of circuit substrate.

2. The electrical connection socket according to claim 1, wherein the plurality of ground pins are disposed to be electrically connected to surfaces of inner walls of the plurality of second through holes respectively.

3. The electrical connection socket according to claim 2, wherein
the plurality of ground pins and the inner walls of the plurality of second through holes are not in contact with each other in a lower-side region in the plurality of second through holes and are in contact with each other in an upper-side region in the plurality of second through holes.

4. The electrical connection socket according to claim 1, wherein
the signal pin is inserted into the first through hole such that an outer circumferential surface of the signal pin is away from the inner wall surface of the first through hole.

5. The electrical connection socket according to claim 1, wherein
the signal pin is configured to include a pin barrel fixed in the first through hole, and first and second plungers coupled to the pin barrel at an upper end portion and a lower end portion of the pin barrel, respectively, so as to be slidable in an up-down direction with respect to the pin barrel.

6. The electrical connection socket according to claim 1, wherein the electric component is an integrated circuit (IC) package.

* * * * *